(12) United States Patent　　　(10) Patent No.:　US 12,572,081 B2
Pnini　　　　　　　　　　　　　　　　(45) Date of Patent:　Mar. 10, 2026

(54) OPTICAL SYSTEM AND PROJECTION EXPOSURE APPARATUS

(71) Applicant: Carl Zeiss SMT GmbH, Oberkochen (DE)

(72) Inventor: Boaz Pnini, Valkenswaard (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 123 days.

(21) Appl. No.: 18/438,842

(22) Filed: Feb. 12, 2024

(65) Prior Publication Data

US 2024/0184212 A1　Jun. 6, 2024

Related U.S. Application Data

(63) Continuation of application No. PCT/EP2022/068559, filed on Jul. 5, 2022.

(30) Foreign Application Priority Data

Aug. 19, 2021　(DE) ..................... 10 2021 209 099.0

(51) Int. Cl.
G03F 7/00 (2006.01)
(52) U.S. Cl.
CPC ...... G03F 7/70316 (2013.01); G03F 7/70233 (2013.01); G03F 7/70983 (2013.01)
(58) Field of Classification Search
CPC ............. G03F 7/70316; G03F 7/70233; G03F 7/70983; G03F 7/70833; G03F 7/70825; G02B 7/1827; G02B 17/06
See application file for complete search history.

(56) References Cited

U.S. PATENT DOCUMENTS

| | | | |
|---|---|---|---|
| 6,573,978 B1 | 6/2003 | McGuire, Jr. | |
| 10,571,807 B2 * | 2/2020 | Schipper | G03F 9/7011 |
| 10,809,636 B2 * | 10/2020 | Gellrich | G03F 7/70316 |
| 11,994,793 B1 * | 5/2024 | Miller | G02B 7/021 |
| 2006/0132747 A1 | 6/2006 | Singer et al. | |
| 2018/0074303 A1 | 3/2018 | Schwab | |
| 2018/0113386 A1 | 4/2018 | Schipper | |

FOREIGN PATENT DOCUMENTS

| | | |
|---|---|---|
| DE | 10 2008 009 600 A1 | 8/2009 |
| DE | 10 2017 200 622 A1 | 12/2017 |
| DE | 10 2017 220 586 A1 | 5/2019 |

(Continued)

OTHER PUBLICATIONS

International Search Report and Written Opinion for corresponding PCT Appl No. PCT/EP2022/068559, dated Nov. 22, 2022.

*Primary Examiner* — Hung V Nguyen
(74) *Attorney, Agent, or Firm* — Fish & Richardson P.C.

(57) ABSTRACT

An optical system for a projection exposure apparatus comprises: a first component; a second component which is actuable within an actuation region relative to the first component; and an end stop device which permits a movement of the second component relative to the first component within the actuation region and which blocks it outside the actuation region. The end stop device comprises a bending element having a stiffness which increases abruptly upon reaching a limit of the actuation region to block the movement of the second component relative to the first component.

20 Claims, 6 Drawing Sheets

(56)         References Cited

FOREIGN PATENT DOCUMENTS

| EP | 1614008 B1 | 12/2009 |
| JP | H08-93318 A | 4/1996 |
| WO | WO 2009/083476 A1 | 7/2009 |
| WO | WO 2013/120839 A2 | 8/2013 |
| WO | WO 2020/224893 | 11/2020 |

* cited by examiner

OPTICAL SYSTEM AND PROJECTION EXPOSURE APPARATUS

CROSS-REFERENCE TO RELATED APPLICATIONS

The present application is a continuation of, and claims benefit under 35 USC 120 to, international application No. PCT/EP2022/068559, filed Jul. 5, 2022, which claims benefit under 35 USC 119 of German Application No. 10 2021 209 099.0, filed Aug. 19, 2021. The entire disclosure of each these applications is incorporated by reference herein.

FIELD

The present disclosure relates to an optical system for a projection exposure apparatus and to a projection exposure apparatus comprising such an optical system.

BACKGROUND

Microlithography is used for producing microstructured component elements, such as for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light having a wavelength in the range from 0.1 nm to 30 nm, in particular 13.5 nm, are currently under development. In the case of such EUV lithography apparatuses, because of the high absorption of light having this wavelength by most materials, reflective optical units, that is to say mirrors, are generally used instead of—as previously—refractive optical units, that is to say lens elements.

In order to reduce potential damage to the optical units or other component elements, such as for example a sensor frame, of the projection system due to tremors, it is possible to place between a force frame and the sensor frame what is known as an end stop, which delimits the movability between the force frame and the sensor frame. Such an end stop can include a bolt, connected to the force frame, and a sleeve, which is provided at the sensor frame and accommodates the bolt with play.

This play can make a movement of the sensor frame with respect to the force frame in an actuated region possible. In the case of a strong tremor, the bolt can make contact with the sleeve. This can firstly result in great forces that act on the sensor frame, and, secondly, the direct contact between the metallic bolt and the metallic sleeve can result in undesirable particle abrasion.

SUMMARY

The present disclosure seeks to provide an improved optical system.

The disclosure proposes an optical system, which comprises a first component, a second component, wherein the second component is actuable within an actuation region relative to the first component, and an end stop device, which permits a movement of the second component relative to the first component within the actuation region and blocks it outside the actuation region, wherein the end stop device comprises a bending element, whose stiffness increases abruptly upon reaching a limit of the actuation region so as to block the movement of the second component relative to the first component.

Owing to the fact that the bending element can abruptly change its stiffness depending on its deflection, it is possible to design the end stop device such that, for example in the case of a strong tremor during which the limit of the actuation region is reached, stiffening of the bending element is brought about and thus the movement of the second component relative to the first component can be stopped. It is thus possible to prevent components of the end stop device from coming into direct touching contact. For this purpose, both the introduction of great forces into the components and also the formation of particles can be prevented.

The optical system can be a projection lens or a projection optical unit of the projection exposure apparatus or a part of such a projection optical unit. However, the optical system can also be part of an illumination optical unit. The first component and the second component can be arbitrary components of the optical system. For example, the first component can be a force frame and the second component can be a sensor frame. However, the components can also comprise optical elements, measurement instruments or the like.

The fact that the second component is actuable within an "actuation region" relative to the first component means in the present case that the second component can be moved relative to the first component in a specific region which is, for example, manageable by an actuator or an actuating element. "Actuating" in the present case is understood to mean moving the second component relative to the first component with the aid of the actuator or actuating element. The second component can be mounted with the aid of weight-compensating support. Such support can also be referred to as active vibration insulation system (AVIS). That means that the second component can be deflected in a force-free manner.

Accordingly, the end stop device within the actuation region exerts no force, or optionally nearly no force, onto the second component, such that the latter is freely actuable. Outside the admissible actuation region, the end stop device blocks the second component with respect to the first component, and as a result, no relative movement of the components with respect to each other can occur outside the actuation region.

For example, the bending element can permit the movement of the second component relative to the first component within the actuation region, wherein, when the deflection of the bending element reaches the limit of the actuation region, the bending element stiffens automatically in a manner such that the bending element blocks the movement of the second component relative to the first component. That is to say that the stiffness of the bending element outside the actuation region is so high that a movement of the second component relative to the first component is not possible or is possible only with an increased expenditure of force. The "limit" of the actuation region in the present case is to be understood to mean that the bending element reaches it when it has been deflected so far that a further deflection is no longer possible without moving beyond the actuation region. The stiffness of the bending element outside the actuation region can be infinitely great as compared to within the actuation region.

An "abrupt" increase in stiffness is to be understood to mean in particular that the stiffness increases greatly, for example by a multiple, in a region of the deflection of the bending element of a few μm, for example of less than 100 μm. This abrupt increase in stiffness is attained in particular only or exclusively by a suitable geometric design of the bending element. The bending element thus does not have a linear behaviour, as does for example a cylindrical spring. This behaviour of the bending element can be referred to as a mechanical or kinematic singularity. The "singularity" is correspondingly understood to mean the behaviour of the bending element to display a linear behaviour up to a certain point, for example reaching the limit of the actuation region, and, after the point, to display a non-linear behaviour, specifically an abrupt increase in stiffness. This behaviour, or the mechanical or kinematic singularity, is attained in particular exclusively by way of a suitable geometric design of the bending element.

The end stop device can comprise a plurality of bending elements. Within the actuation region, the bending element can be flexible in a way such that the actuation of the second component with respect to the first component is not influenced, or influenced only insignificantly. As a result, the bending element does not exert any or only a very small force onto the second component. In other words, the bending element within the actuation region cannot transfer any or at least only a very small amount of force from the first component onto the second component.

As soon as the bending element is deflected such that it leaves the actuation region or the limit or a periphery thereof is reached, the bending element stiffens automatically. "Automatically" or "by itself" in the present case means that the bending element can move due to its constructive design from a non-stiffened state into a stiffened state without an external actuator and without the introduction of external energy. Starting from the limit of the actuation region, or outside the actuation region, the bending element is then stiff in a manner such that the movement of the second component relative to the first component is blocked with the aid of the bending element.

According to an embodiment, the stiffness of the bending element outside the actuation region is greater by a multiple than within the actuation region.

The "multiple" in the present case is understood to mean for example an order of magnitude of at least ten times. The "stiffness" in the present case is quite generally understood to mean the resistance of a body to a force or a moment. The stiffness is here dependent on the geometry of the body and on the material used. The greater the stiffness, the greater the resistance of the body to deformation.

According to an embodiment, the stiffness of the bending element increases abruptly within a deflection distance of the bending element of less than 100 μm.

Depending on the constructive design of the bending element, the deflection distance can be defined in an arbitrary way. As soon as the second component has moved by a distance of 100 μm with respect to the first component upon reaching the limit of the actuation region, the bending element abruptly stiffens, with the result that the movement of the second component with respect to the first component is blocked. That is to say that the abrupt stiffening takes place within the deflection distance.

According to an embodiment, the stiffness of the bending element outside the actuation region is a hundred times or more the stiffness within the actuation region.

The stiffness outside the actuation region can even be a hundred and fifty times to two hundred times the stiffness within the actuation region. In general, the stiffness outside the actuation region is a multiple of the stiffness within the actuation region. In comparison with a conventional spring, however, the stiffness increases within a very short deflection distance, which can be, as previously mentioned, less than 100 μm.

According to an embodiment, the bending element comprises an arcuately curved first leaf spring portion and an accurately curved second leaf spring portion, wherein the first leaf spring portion and the second leaf spring portion are curved in opposite directions.

The first leaf spring portion and the second leaf spring portion can in each case be curved in the shape of a circular arc. For example, the first leaf spring portion and the second leaf spring portion have identical curvatures oriented in opposite directions. The fact that the first leaf spring portion and the second leaf spring portion are "curved in opposite directions" means here that the first leaf spring portion and the second leaf spring portion are oriented away from each other in a belly-shaped manner. The leaf spring portions are in each case spring-pretensioned into their arcuate geometry.

According to an embodiment, the first leaf spring portion and the second leaf spring portion are connected to each other in each case at the end sides with the aid of a first connection portion and a second connection portion.

The connection portions can be, for example, cuboidal. However, the connection portions can have any geometry. In each case one end portion of the first leaf spring portion and of the second leaf spring portion is connected to each connection portion. Starting from the two connection portions, the first leaf spring portion and the second leaf spring portion curve outwardly in the direction of a centre between the connection portions. The first leaf spring portion and the second leaf spring portion have the farthest distance from each other centrally between the connection portions.

According to an embodiment, the stiffness of the bending element increases abruptly upon reaching the limit of the actuation region by virtue of the fact that the first leaf spring portion and the second leaf spring portion align themselves parallel to each other.

Here, a transition occurs from the flexural stiffness of the leaf spring portions to the tensile strength of the leaf spring portions, which is greater by a multiple than the flexural stiffness. The bending element stiffens if the deflection of the bending element reaches the limit of the actuation region, for example by itself on account of the fact that the first leaf spring portion and the second leaf spring portion align themselves parallel to each other. That is to say that the arcuate curvature of the first leaf spring portion and the arcuate curvature of the second leaf spring portion are flattened such that the first leaf spring portion and the second leaf spring portion extend parallel to each other or directly lie against each other. The leaf spring portions then no longer have any spring action resulting from their curvatures.

According to an embodiment, the bending element permits the movement of the second component relative to the first component within the actuation region on account of the fact that the first leaf spring portion and the second leaf spring portion spring-elastically deform as part of their arcuate curvature.

This means in particular that, during the actuation of the second component relative to the first component, the arcuate curvature of the first leaf spring portion and of the second leaf spring portion changes, with the result that the second component can move within its actuation region.

According to an embodiment, the end stop device permits the movement of the second component relative to the first component within the actuation region in two degrees of freedom and blocks the movement outside the actuation region in the two degrees of freedom.

The second component can have six degrees of freedom, namely three translational degrees of freedom along an x-direction, a y-direction and a z-direction, and three rotational degrees of freedom or tilting degrees of freedom about the x-direction, the y-direction and the z-direction, respectively. Two of these degrees of freedom are assigned to each end stop device. These two degrees of freedom are permitted or blocked, depending on whether the second component is located within the actuation region or outside the actuation region.

According to an embodiment, the optical system furthermore comprises at least three end stop devices, wherein each end stop device is assigned in each case two degrees of freedom.

The number of the end stop devices can be arbitrary, however. For example, eight end stop devices may also be provided.

According to an embodiment, the stiffness of the bending element upon reaching the limit of the actuation region abruptly increases both in the case of a tensile force acting on the bending element and also in the case of a compressive force acting on the bending element in a manner such that the bending element blocks the movement of the second component relative to the first component.

For example, the bending element stiffens when the deflection of the bending element reaches the limit of the actuation region, both in the case of the tensile force acting on the bending element and also in the case of the compressive force acting on the bending element automatically in a manner such that the bending element blocks the movement of the second component relative to the first component. For this purpose, the bending element can have more than two leaf spring portions. For example, the bending element can have four leaf spring portions, wherein in each case two leaf spring portions are connected at the end sides to a common connection portion. Accordingly, two connection portions that are not connected to each other are provided at an end portion of the leaf spring portions. Facing away from these two connection portions, all four leaf spring portions are connected to a common connection portion. In this way, the bending element can absorb both compressive forces and tensile forces.

According to an embodiment, the first component is coupled to the second component with the aid of the bending element.

"Coupled" means here that the first component is connected to the second component with the aid of the bending element. However, this connection can be of a manner such that no forces or only very small forces are transferable within the actuation region. Outside of the actuation region, large forces are correspondingly transferable.

According to an embodiment, the first component is a force frame and the second component is a sensor frame.

As mentioned previously, the components can, however, also be any other component parts of the projection exposure apparatus or of the projection optical unit.

According to an embodiment, the bending element is a one-piece component part, in particular a component part that is materially in one piece.

"One-piece" here means that the bending element is one component part throughout, rather than being composed of different component parts. That means that the leaf spring portions and the connection portions together form a common component part. "Materially in one piece" means here that the bending element is produced from the same material throughout. For example, the bending element is produced from steel, in particular stainless steel.

Furthermore, a projection exposure apparatus with such an optical system is proposed.

The optical system can be a projection optical unit or a part of a projection optical unit of the projection exposure apparatus. The projection exposure apparatus can comprise a plurality of optical systems. The projection exposure apparatus can be a EUV lithography apparatus. EUV stands for "extreme ultraviolet" and denotes a wavelength of the working light of between 0.1 nm and 30 nm. The projection exposure apparatus can also be a DUV lithography apparatus. DUV stands for "deep ultraviolet" and denotes a wavelength of the working light of between 30 nm and 250 nm.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the optical system apply correspondingly to the proposed projection exposure apparatus, and vice versa.

Further possible implementations of the disclosure also comprise not explicitly mentioned combinations of any features or embodiments that are described above or below with respect to the exemplary embodiments. In this case, a person skilled in the art will also add individual aspects as improvements or supplementations to the respective basic form of the disclosure.

Further refinements and aspects of the disclosure are the subject matter of the dependent claims and also of the exemplary embodiments of the disclosure described below. In the text that follows, the disclosure will be explained in more detail on the basis of example embodiments with reference to the accompanying figures.

DETAILED DESCRIPTION

Unless indicated to the contrary, elements that are the same or functionally the same have been provided with the same reference signs in the figures. It should also be noted that the illustrations in the figures are not necessarily true to scale.

Figure 1:
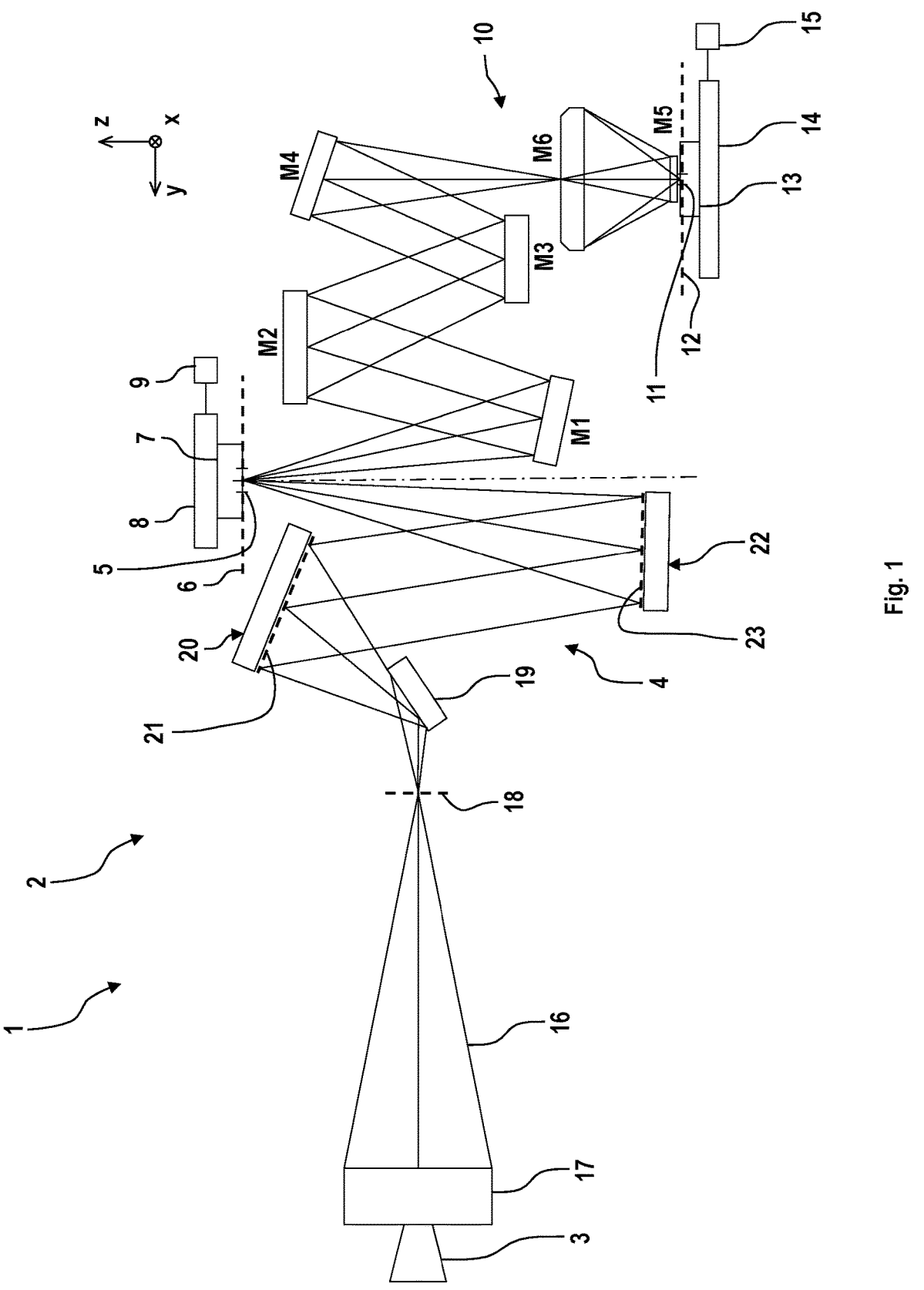
FIG. 1 shows a schematic meridional section of a projection exposure apparatus for EUV projection lithography.

FIG. 1 shows an embodiment of a projection exposure apparatus 1 (lithography apparatus), such as an EUV lithography apparatus. An embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, in particular in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y extends horizontally, and the z-direction z extends vertically. The scanning direction in FIG. 1 extends along the y-direction y. The z-direction z extends perpendicularly to the object plane 6.

The projection exposure apparatus 1 comprises a projection optical unit 10. The projection optical unit 10 serves for imaging the object field 5 into an image field 11 in an image plane 12. The image plane 12 runs parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, in particular along the y-direction y. The displacement, on the one hand, of the reticle 7 by way of the reticle displacement drive 9 and, on the other hand, of the wafer 13 by way of the wafer displacement drive 15 can take place in such a way as to be synchronized with each other.

The light source 3 is an EUV radiation source. The light source 3 emits, in particular, EUV radiation 16, which is also referred to below as used radiation, illumination radiation or illumination light. In particular, the used radiation 16 has a wavelength in the range between 5 nm and 30 nm. The light source 3 can be a plasma source, for example an LPP (laser produced plasma) source or a GDPP (gas discharge produced plasma) source. It can also be a synchrotron-based radiation source. The light source 3 can be an FEL (free-electron laser).

The illumination radiation 16 emerging from the light source 3 is focused by a collector 17. The collector 17 may be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which can also be referred to as field facets. Only some of these first facets 21 are shown in FIG. 1 by way of example.

The first facets 21 can be in the form of macroscopic facets, such as as rectangular facets or as facets with an arcuate peripheral contour or a peripheral contour of part of a circle. The first facets 21 may be in the form of plane facets or alternatively as convexly or concavely curved facets.

As known for example from DE 10 2008 009 600 A1, the first facets 21 themselves may also be composed in each case of a multiplicity of individual mirrors, in particular a multiplicity of micromirrors. The first facet mirror 20 can in particular be formed as a microelectromechanical system (MEMS system). For details, reference is made to DE 10 2008 009 600 A1.

Between the collector 17 and the deflection mirror 19, the illumination radiation 16 travels horizontally, that is to say along the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can for example have a round, rectangular or hexagonal periphery, or alternatively be facets made up of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This fundamental principle is also referred to as a fly's eye condenser (fly's eye integrator).

It can be desirable to arrange the second facet mirror 22 not exactly in a plane that is optically conjugate to a pupil plane of the projection optical unit 10. For example, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or else, in fact, the last mirror for the illumination radiation 16 in the beam path upstream of the object field 5.

In a further embodiment, not shown, of the illumination optical unit 4, a transfer optical unit contributing in particular to the imaging of the first facets 21 into the object field 5 can be arranged in the beam path between the second facet mirror 22 and the object field 5. The transfer optical unit can have exactly one mirror or alternatively have two or more mirrors, which are arranged one behind the other in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20 and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are similarly possible. The projection optical unit 10 is a twice-obscured optical unit. The penultimate mirror M5 and the last mirror M6 each have a through opening for the illumination radiation 16. The projection optical unit 10 has an image-side numerical aperture that is greater than 0.5 and may also be greater than 0.6, and may be for example 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, in particular with alternating layers of molybdenum and silicon.

The projection optical unit 10 has a large object-image offset in the y-direction y between a y-coordinate of a centre of the object field 5 and a y-coordinate of the centre of the image field 11. In the y-direction y, this object-image offset can be of approximately the same magnitude as a z-distance between the object plane 6 and the image plane 12.

The projection optical unit 10 can have an anamorphic form. For example, it can have different imaging scales βx, βy in the x- and y-directions x, y. The two imaging scales βx, βy of the projection optical unit 10 can be (βx, βy)= (+/−0.25, +/−0.125). A positive imaging scale β means imaging without image inversion. A negative sign for the imaging scale β means imaging with image inversion.

The projection optical unit 10 consequently can lead to a reduction in size with a ratio of 4:1 in the x-direction x, that is to say in a direction perpendicular to the scanning direction.

The projection optical unit 10 can lead to a reduction in size of 8:1 in the y-direction y, that is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 can be the same or can differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This may for example produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner superposed on one another for the purposes of illuminating the object field 5. The illumination of the object field 5 is typically as homogeneous as possible. It can have a uniformity error of less than 2%. The field uniformity can be achieved by way of the superposition of different illumination channels.

The full-area illumination of the entrance pupil of the projection optical unit 10 can be defined geometrically by an arrangement of the second facets 23. The intensity distribution in the entrance pupil of the projection optical unit 10 can be set by selecting the illumination channels, in particular the subset of the second facets 23, which guide light. This intensity distribution is also referred to as illumination setting or illumination pupil filling.

A likewise preferred pupil uniformity in the region of sections of an illumination pupil of the illumination optical unit 4 which are illuminated in a defined manner can be achieved by a redistribution of the illumination channels.

Further aspects and details of the illumination of the object field 5 and in particular of the entrance pupil of the projection optical unit 10 are described below.

The projection optical unit 10 can have a homocentric entrance pupil. The latter can be accessible. It can also be inaccessible.

The entrance pupil of the projection optical unit 10 frequently cannot be exactly illuminated with the second facet mirror 22. When imaging the projection optical unit 10, which images the centre of the second facet mirror 22 telecentrically onto the wafer 13, the aperture rays often do not intersect at a single point. However, it is possible to find an area in which the distance of the aperture rays determined in pairs becomes minimal. This area represents the entrance pupil or an area in real space that is conjugate thereto. This area can have a finite curvature.

It may be the case that the projection optical unit 10 has different positions of the entrance pupil for the tangential beam path and for the sagittal beam path. In this case, an imaging element, such as an optical component element of the transfer optical unit, should be provided between the second facet mirror 22 and the reticle 7. With the aid of this optical element, the different positions of the tangential entrance pupil and the sagittal entrance pupil can be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 6. The first facet mirror 20 is arranged so as to be tilted in relation to an arrangement plane defined by the deflection mirror 19. The first facet mirror 20 is arranged in tilted fashion with respect to an arrangement plane defined by the second facet mirror 22.

Figure 2:
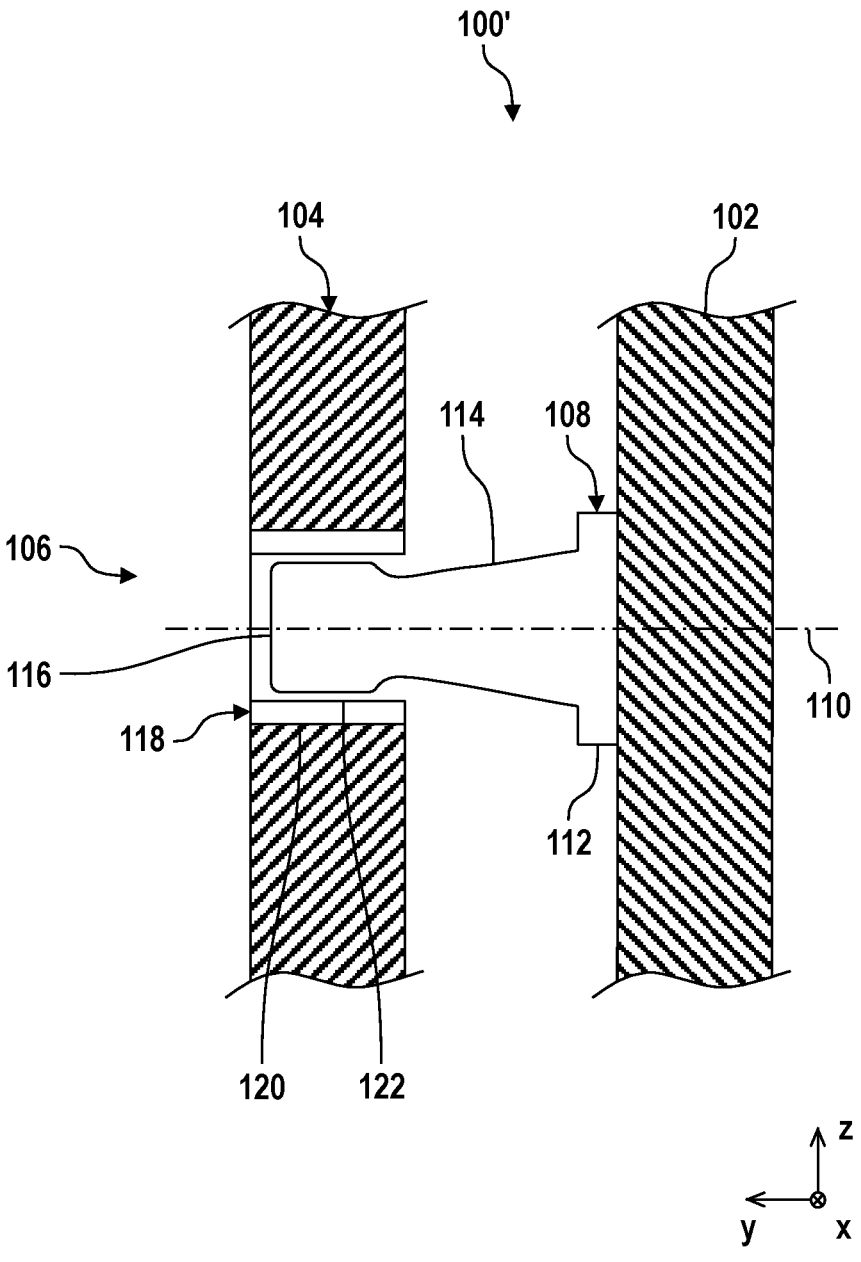
FIG. 2 shows a schematic partial sectional view of an embodiment of an optical system for the projection exposure apparatus in accordance with FIG. 1.

FIG. 2 shows a schematic partial view of an embodiment of an optical system 100'. The optical system 100' is a projection optical unit 10 as explained previously, or part of a projection optical unit 10 as explained previously. The optical system 100' comprises a first component 102 and a second component 104. The first component 102 can be what is known as a force frame. The second component 104 can be what is known as a sensor frame. The components 102, 104 can be produced from a ceramic material. Alternatively, only one of two components 102, 104 might be produced from a ceramic material.

The second component 104 is mounted with the aid of a weight-compensating support (active vibration isolation system, AVIS), with the result that the second component 104 can move in a force-free manner. The second component 104 has, with respect to the first component 102, a specific actuated region or actuation region, within whose limits the second component 104 can move with respect to the first component 102. The second component 104 can here have six degrees of freedom, namely three translational degrees of freedom along the x-direction x, the y-direction y and the z-direction z, respectively, and three rotational degrees of freedom or tilting degrees of freedom about the x-direction x, the y-direction y and the z-direction z, respectively.

In order to delimit a movement amplitude of the second component 104, for example in the event of a tremor, with respect to the first component 102, an end stop device 106 can be provided. The end stop device 106 comprises an end stop 108, which is fixedly connected, for example screw-connected, to the first component 102. The end stop 108 can be constructed rotationally symmetrically with respect to a centre axis or axis of symmetry 110.

The end stop 108 comprises a plate-type base portion 112, which can be screw-connected to the first component 102. Connected to the base portion 112 is a conical connection portion 114. A cylindrical contact portion 116 is situated on the connection portion 114. The end stop 108 is a one-piece component part, in particular one which is materially in one piece. "One-piece" here means that the end stop 108 is not composed of various component parts, but forms a single component part. "Materially in one piece" means here that the end stop 108 is produced from the same material throughout, for example from steel.

In addition to the end stop 108, the end stop device 106 comprises a socket or sleeve 118, in which the contact portion 116 is accommodated. The sleeve 118 can be adhesively bonded into a hole 120 provided in the second component 104. The contact portion 116 can move with respect to the sleeve 118 in a translational manner along the y-direction y. Furthermore, a gap that runs radially around the contact portion 116 is provided between the sleeve 118, such as an inner wall 122 of the sleeve 118, and the contact portion 116. This gap permits a slight movement of the contact portion 116 with respect to the sleeve 118 in the x-direction x and the z-direction z and thus defines the actuation region.

This previously mentioned possible radial movement of the contact portion 116 with respect to the sleeve 118 allows actuation of the second component 104 with respect to the first component 102 in the actuation region. At least three end stop devices 106 are provided here. Each of the end stop devices 106 permits one translational movement along one of the directions x, y, z and two minor translational movements with respect to the other two directions x, y, z up to a contact of the contact portion 116 with the sleeve 118. If a limit of the actuation region is reached, the contact portion 116 is in contact with the sleeve 118.

During operation of the optical system 100' or of the projection optical unit 10, strong tremors and accelerations of 2 to 3 g can occur, for example caused by an earthquake. In the case of an earthquake, forces of up to 50 kN can be absorbed by the end stop device 106. Due to the direct contact of the contact portion 116 with the sleeve 116, large forces can be transferred to the second component 104. This may be an issue in as far as the second component 104 and the mirrors M1 to M6 are produced from ceramic materials that can break under excessive loads.

Within the actuation region, that is to say within the region in which the contact portion 116 is not yet in contact with the sleeve 118, the second component 104 can move in a force-free manner due to it being supported in a weight-compensating manner. As soon as a strong tremor acts on the optical system 100', the contact portion 116 makes contact with the sleeve 118, which results in metal-to-metal contact This has the effect that great forces can act on the end stop device 106 and lead to the second component 104 breaking, and the metal-to-metal contact can result in friction and particles being formed, which is undesired.

A challenge is to limit the movement of the second component 104 outside the actuation region and to minimize the influence of the end stop device 106 within the actuation region. This can be achieved by way of designing a bending element that has a very low stiffness within the actuation region and has a very great stiffness outside the actuation region. It is possible in this way to realize a permanent connection between the components 102, 104 and at the same time to prevent a collision.

Figure 3:
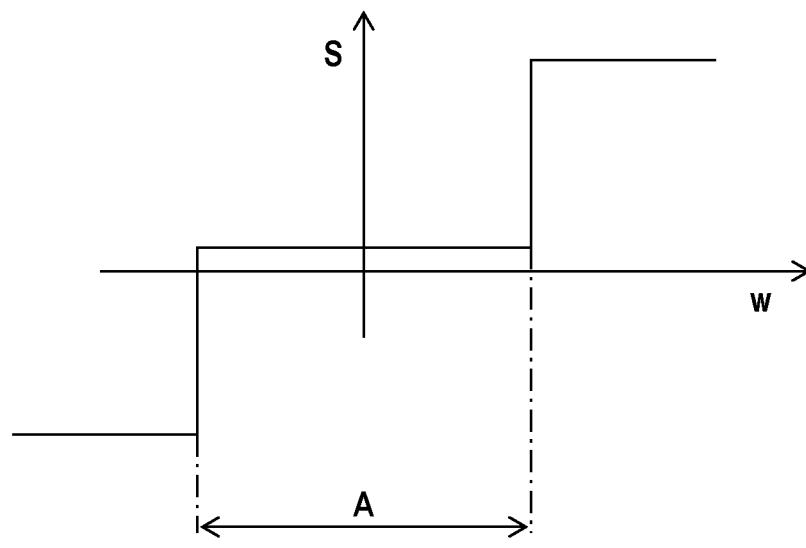
FIG. 3 shows a schematic profile of a stiffness of a bending element for the optical system in accordance with FIG. 2 over a deflection distance of the bending element.

FIG. 3 shows a schematic diagram with the principal function of a bending element as mentioned previously. The stiffness is plotted on the ordinate. In FIG. 3, the stiffness is denoted by the letter S. The "stiffness" in the present case is quite generally understood to mean the resistance of a body to an elastic deformation due to a force or a moment. The stiffness is dependent on the geometry of the body and on the material used. The greater the stiffness is, the greater is the force or the moment to deform the body.

A deflection distance w of the bending element is plotted on the abscissa in FIG. 3. As previously mentioned, an actuation region A is provided. In the actuation region A, the bending element has a very low stiffness, which can be constant or nearly constant within the actuation region A. Outside the actuation region A or at limits of the actuation region A, the stiffness increases abruptly. The actuation region A can be, for example, 100 to 200 μm.

The second component 104 can be moved in a nearly forceless manner in the actuation region A. The bending element involves in the actuation region A only a few Newtons of force for the deformation thereof. Outside the actuation region A, the force for deformation or the stiffness increases abruptly over a very small deflection distance w. In a conventional spring, a very long spring travel would be involved for such behaviour. A linear spring can accordingly not be used as a bending element. The bending element thus does not act linearly and has what is known as a mechanical or kinematic singularity. This can be understood to mean in particular that the bending element has a linear behaviour up to a certain point, and no more linear behaviour after that point.

Figure 4:
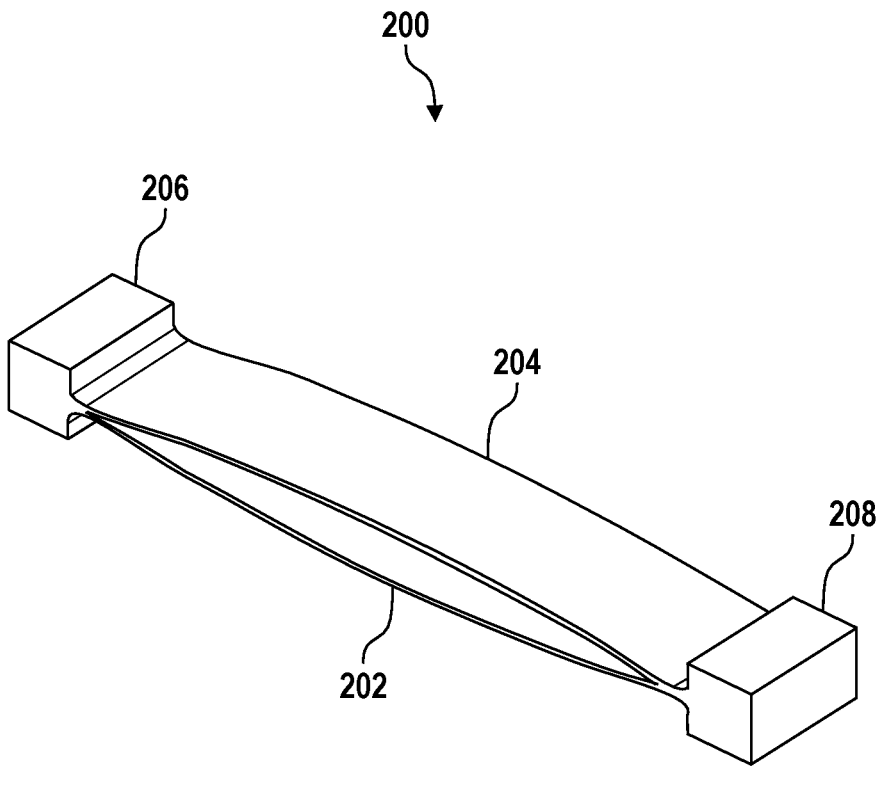
FIG. 4 shows a schematic perspective view of an embodiment of a bending element for the optical system according to FIG. 2.

FIG. 4 shows a schematic perspective view of an embodiment of a bending element 200 as mentioned previously. The bending element 200 can be part of the end stop device 106. In this case, the end stop device 106 does not have the end stop 108 and sleeve 118. Rather, the bending element 200 couples the components 102, 104 to each other. That means that the bending element 200 connects the second component 104 to the first component 102. The end stop device 106 can comprise a plurality of bending elements 200.

The bending element 200 comprises two curved or protruding leaf spring portions 202, 204. A first leaf spring portion 202 and a second leaf spring portion 204 are provided. In a forceless or non-loaded state, the leaf spring portions 202, 204 are curved outwardly away from each other, as shown in FIG. 4. The leaf spring portions 202, 204 are spring-pretensioned. That means that the leaf spring portions 202, 204 rest against each other when they are compressed and automatically move back into the state shown in FIG. 4 when they are released.

At the end sides, the leaf spring portions 202, 204 are connected to each other in each case with the aid of connection portions 206, 208. The connection portions 206, 208 can be cuboidal. The leaf spring portions 202, 204 and the connection portions 206, 208 can be formed in one piece, in particular materially in one piece. For example, the bending element 200 is produced from steel, in particular stainless steel.

Figure 5:
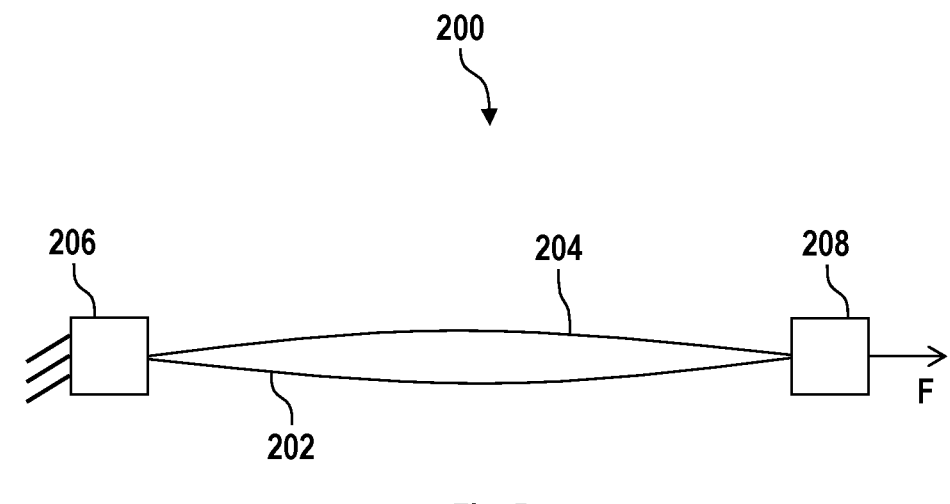
FIG. 5 shows a schematic side view of the bending element in accordance with FIG. 4.
Figure 6:
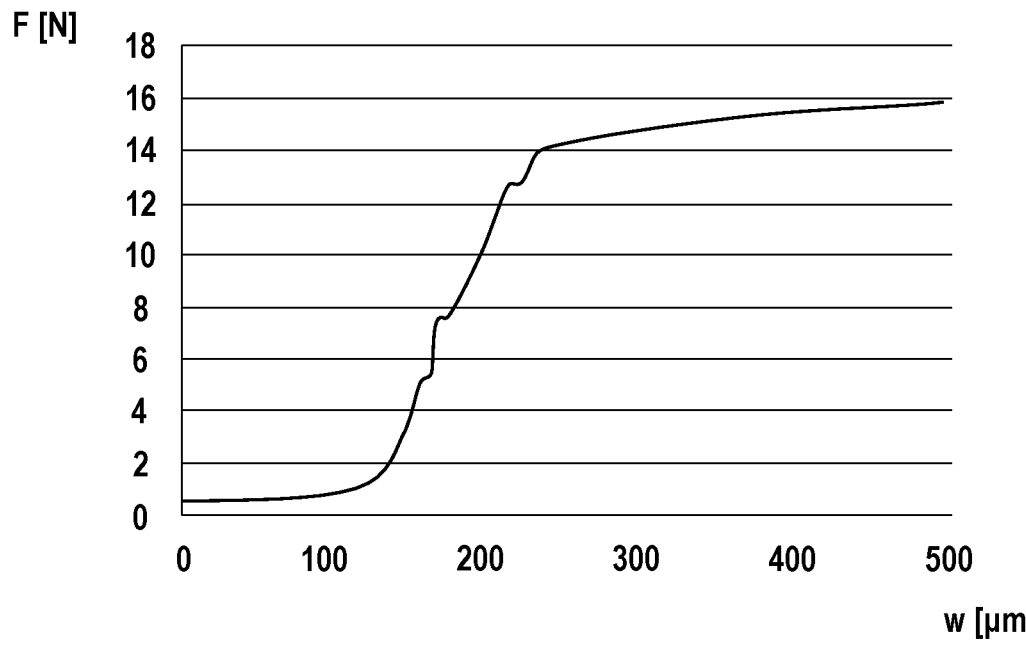
FIG. 6 shows a schematic force-deflection distance diagram of the bending element in accordance with FIG. 4.

FIG. 5 shows a schematic side view of the bending element 200. FIG. 6 shows the profile of a force F in N acting on the bending element 200 over the deflection distance w of the bending element 200 in μm.

In the orientation of FIG. 5, the bending element 200 is clamped at its connection portion 206. In the orientation of FIG. 5 on the right, the force F now acts on the connection portion in the form of a tensile force. FIG. 5 shows the bending element 200 initially in a force-free or forceless state, in which the leaf spring portions 202, 204 are bent away or curved away from each other.

As soon as a small force F, in the present case of less than 1 N, acts on the bending element 200, the leaf spring portions 202, 204 approach each other, wherein the protrusion of the leaf spring portions 202, 204 diminishes. Up to a deflection distance w of approximately 100 μm, the force F increases only slightly. As soon as the leaf spring portions 202, 204 are extended, that is to say as soon as the leaf spring portions 202, 204 no longer have any protrusion and extend parallel to each other or rest against each other, the force F increases abruptly starting from a deflection distance w of approximately 100 μm for a further extension of the bending element 200 up to approximately 14 N. Starting from the deflection distance w of approximately 100 μm, the stiffness of the bending element 200 increases approximately by the factor of 100.

An end stop device 106 as explained previously can comprise one bending element 200 or a multiplicity of bending elements 200 as previously explained. In terms of construction, the bending element 200 can also be configured such that it acts both in the pulling direction and also in the compression direction. That is to say that the bending element 200 stiffens both when a tensile force, specifically the previously mentioned force F, is applied and also when a compressive force is applied. The previously mentioned stiffening effect then occurs both in the pulling direction and also in the compression direction.

Figure 7:
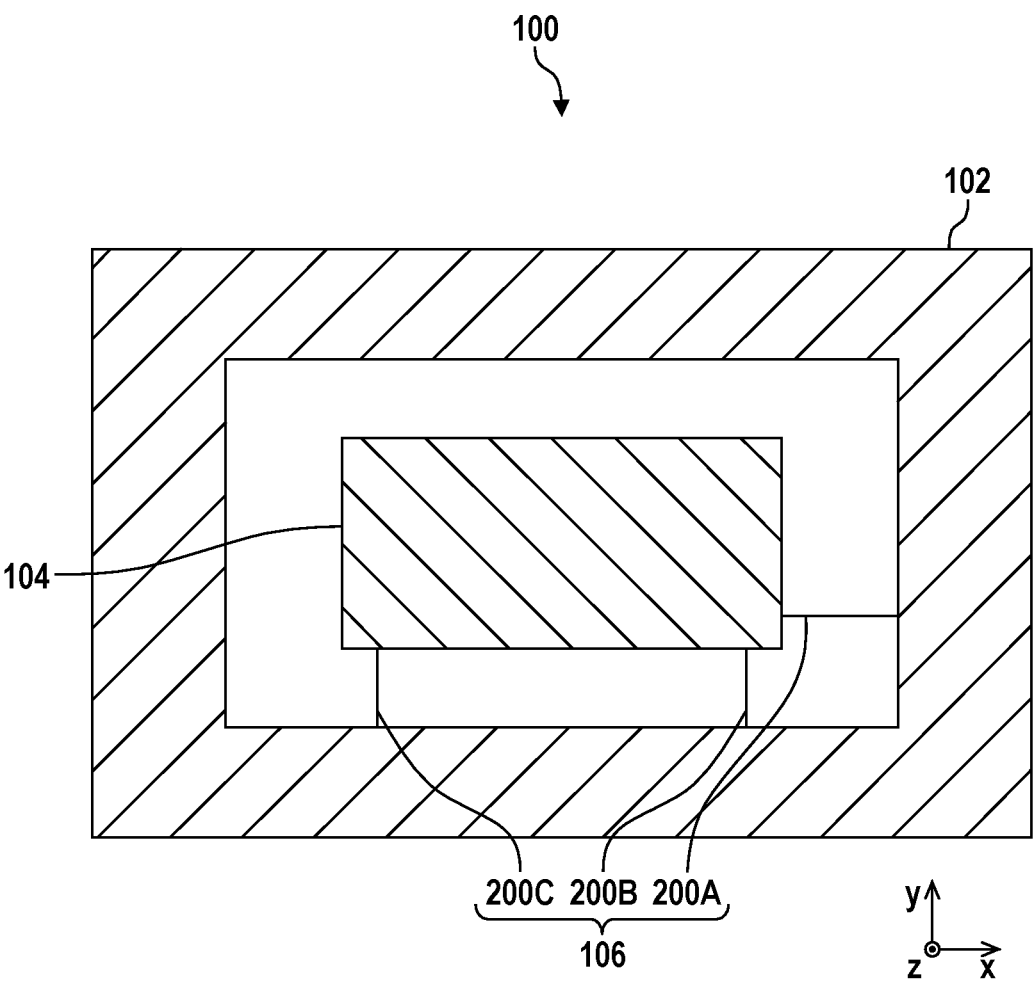
FIG. 7 shows a schematic sectional view of a further embodiment of an optical system for the projection exposure apparatus in accordance with FIG. 1.

FIG. 7 shows a schematic sectional view of a further embodiment of an optical system 100 for the projection exposure apparatus 1. The optical system 100 comprises a first component 102, which may be a force frame, and a second component 104, which may be a sensor frame. The optical system 100 in the present case is viewed in a simplified manner in two-dimensional space. That is to say that the second component 104 has, with respect to the first component 102, three degrees of freedom, specifically a translational degree of freedom along the x-direction x, a translational degree of freedom along the y-direction y and a rotational degree of freedom about the z-direction z.

The optical system 100 comprises an end stop device 106 as mentioned previously, which has a plurality of, in particular three, bending elements 200A, 200B, 200C. The second component 104 is coupled to the first component 102 with the aid of the bending elements 200A, 200B, 200C. In this case, the x-direction x is assigned a first bending element 200A. It is assumed that the first bending element 200A can absorb—different from what has been described previously—both tensile forces and also compressive forces. For the event that the first bending element 200A can absorb only tensile forces, two first bending elements 200A are provided, which in the orientation of FIG. 7 are arranged on both sides of the second component 104. The first bending element 200A brings about an end stop along the x-direction x.

A second bending element 200B and a third bending element 200C are assigned to the y-direction y and to the z-direction z. One of the bending elements 200B, 200C brings about an end stop along the y-direction y. Both bending elements 200B, 200C together bring about an end stop with respect to the rotational degree of freedom about the z-direction z. It is also assumed here that the bending elements 200B, 200C can absorb-different from what has been described previously—both tensile forces and also compressive forces. For the event that the bending elements 200B, 200C can absorb only tensile forces, in each case two bending elements 200B, 200C are provided, which in the orientation of FIG. 7 are arranged at the top side and bottom side of the second component 104.

Although the present disclosure has been described on the basis of exemplary embodiments, it can be modified in various ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror 21 First facet
22 Second facet mirror
23 Second facet
100 Optical system
100' Optical system
102 Component
104 Component
106 End stop device
108 End stop
110 Axis of symmetry
112 Base portion
114 Connection portion
116 Contact portion
118 Sleeve
120 Hole
122 Inner wall
200 Bending element
200A Bending element
200B Bending element
200C Bending element
202 Leaf spring portion
204 Leaf spring portion
206 Connection portion
208 Connection portion
A Actuation region
F Force
M1 Mirror
M2 Mirror
M3 Mirror
M4 Mirror
M5 Mirror
M6 Mirror
S Stiffness
W Deflection distance
X x-direction
y y-direction
z z-direction

What is claimed is:

1. An optical system, comprising:
a first component;
a second component actuable relative to the first component within an actuation region; and
an end stop device comprising a bending element,
wherein:
the end stop device permits movement of the second component relative to the first component within the actuation region;
the actuation region has a limit;
the bending element has a stiffness that increases upon reaching the limit of the actuation region to block movement of the second component relative to the first component outside the actuation region;
the bending element comprises first and second arcuately curved first leaf spring portions; and
the first leaf spring portion and the second leaf spring portion are curved in opposite directions.

2. The optical system of claim 1, wherein the stiffness of the bending element increases within a deflection distance of the bending element of less than 100 μm.

3. The optical system of claim 1, wherein the stiffness of the bending element outside the actuation region is at least 100 times greater than the stiffness within the actuation region.

4. The optical system of claim 1, wherein:
the bending element comprises first and second connection portions;

the first connection portion connects a first end side of the first leaf spring portion to a first end side of the second leaf spring portion; and
the second connection portion connects a second end side of the first leaf spring portion the to a second end side of the second leaf spring portion.

5. The optical system of claim 1, wherein, at the limit of the actuation region, the first and second leaf spring portions are parallel to each other.

6. The optical system of claim 1, wherein, within the actuation region, the first and second leaf spring portions are spring-elastically deformable.

7. The optical system of claim 1, wherein:
within the actuation region, the end stop device permits movement of the second component relative to the first component in two degrees of freedom; and
outside the actuation region, the end stop device blocks movement of the second component relative to the first component in the two degrees of freedom.

8. The optical system of claim 7, further comprising at least three end stop devices, wherein each end stop device is assigned a corresponding two degrees of freedom.

9. The optical system of claim 1, wherein the stiffness of the bending element increases upon reaching the limit of the actuation region both when a tensile force acts on the bending element and when a compressive force acts on the bending element, so that the bending element blocks the movement of the second component relative to the first component.

10. The optical system of claim 1, wherein the bending element couples the first component to the second component.

11. The optical system of claim 1, wherein the first component is a force frame, and the second component is a sensor frame.

12. The optical system of claim 1, wherein the bending element is a one-piece component part.

13. The optical system of claim 1, wherein the bending element is materially in one piece.

14. The optical system of claim 1, wherein:
the bending element comprises first and second connection portions;
the first connection portion connects a first end side of the first leaf spring portion to a second end side of the second leaf spring portion;
the second connection portion connects a second end side of the first leaf spring portion the to a second end side of the second leaf spring portion; and
at the limit of the actuation region, the first and second leaf spring portions are parallel to each other.

15. The optical system of claim 14, wherein, within the actuation region, the first and second leaf spring portions are spring-elastically deformable.

16. The optical system of claim 1, wherein:
the bending element comprises first and second connection portions;
the first connection portion connects an end side of the first leaf spring portion to an end side of the second leaf spring portion; and
at the limit of the actuation region, the first and second leaf spring portions are parallel to each other.

17. The optical system of claim 1, wherein:
at the limit of the actuation region, the first and second leaf spring portions are parallel to each other; and
within the actuation region, the first and second leaf spring portions are spring-elastically deformable.

18. An apparatus comprising:

an optical system according to claim 1, wherein the apparatus is a projection exposure apparatus.

19. A method of operating a projection exposure apparatus comprising an illumination system and a projection optical unit, the method comprising:

using the illumination system to illuminate a portion of a reticle comprising a pattern;

using the projection optical unit to project the illuminated pattern of the reticle onto a light sensitive material, wherein the projection exposure apparatus comprises an optical system according to claim 1.

20. The optical system of claim 1, wherein:

the bending element comprises first and second connection portions;

the first connection portion connects a first end side of the first leaf spring portion to a first end side of the second leaf spring portion;

the second connection portion connects a second end side of the first leaf spring portion the to a second end side of the second leaf spring portion;

at the limit of the actuation region, the first and second leaf spring portions are parallel to each other; and within the actuation region, the first and second leaf spring portions are spring-elastically deformable.

* * * * *